United States Patent
Luecken et al.

(10) Patent No.: US 8,592,762 B2
(45) Date of Patent: Nov. 26, 2013

(54) METHOD OF USING A DIRECT ELECTRON DETECTOR FOR A TEM

(75) Inventors: Uwe Luecken, Eindhoven (NL); Alan Frank de Jong, Eindhoven (NL); Gerrit Cornelis van Hoften, Veldhoven (NL); Frank Jeroen Pieter Schuurmans, Valkenswaard (NL)

(73) Assignee: FEI Company, Hillsboro, OR (US)

( * ) Notice: Subject to any disclaimer, the term of this patent is extended or adjusted under 35 U.S.C. 154(b) by 237 days.

(21) Appl. No.: 13/096,865

(22) Filed: Apr. 28, 2011

(65) Prior Publication Data

US 2011/0266439 A1    Nov. 3, 2011

(30) Foreign Application Priority Data

Apr. 28, 2010  (EP) .................................. 10161243

(51) Int. Cl.
*H01J 37/26*    (2006.01)

(52) U.S. Cl.
USPC ............ 250/306; 250/307; 250/309; 250/310

(58) Field of Classification Search
USPC .......................... 250/306, 307, 309, 310, 311
See application file for complete search history.

(56) References Cited

U.S. PATENT DOCUMENTS

2008/0210863 A1    9/2008  Pinna et al.

FOREIGN PATENT DOCUMENTS

JP         2000113854         4/2000

OTHER PUBLICATIONS

Lu et al., "Electron low energy-loss functions of Pb(Mg1/3Nb2/3) o3 : Theory and Experiment," Journal of Applied Physics, Aug. 11, 2008, p. 34109-1-34109-6, vol. 104, No. 3.
Ligges, M., et al., "Observation of Ultrafast Lattice Heating using Time Resolved Electron Diffraction," Applied Physics Letters, Mar. 11, 2009, p. 101910-101910-3, vol. 94, No. 10.
Aronova, M.A., et al., "Three-dimensional Elemental Mapping of Phosphorus by Quantitative Electron Spectroscopic Tomography," Journal of Structural Biology, Sep. 18, 2007, pp. 35-48, vol. 160, No. 1.

*Primary Examiner* — Robert Kim
*Assistant Examiner* — Hanway Chang
(74) *Attorney, Agent, or Firm* — Scheinberg & Associates, PC; Michael O. Scheinberg (57) ABSTRACT

A method of using a direct electron detector in a TEM, in which an image with a high intensity peak, such as a diffractogram or an EELS spectrum, is imaged on said detector. As known the high intensity peak may damage the detector. To avoid this damage, the center of the image is moved, as a result of which not one position of the detector is exposed to the high intensity, but the high intensity is smeared over the detector, displacing the high intensity peak before damage results.

13 Claims, 5 Drawing Sheets

METHOD OF USING A DIRECT ELECTRON DETECTOR FOR A TEM

TECHNICAL FIELD OF THE INVENTION

The invention relates to a method of using an direct electron detector image sensor in a particle-optical apparatus, the particle-optical apparatus comprising a particle source for producing a beam of particles, acceleration means for accelerating the beam of particles, lenses to manipulate the beam of particles, sample positioning means for positioning a sample on a sample position, the method comprising:
  providing a sample on the sample position,
  forming a first image on the sensor showing a high intensity peak at a first position, and lower intensity peaks at other positions,
The invention further relates to an apparatus equipped to perform such a method and a software carrier carrying code for programming such an apparatus.

The method is used when an operator uses a Transmission Electron Microscope (TEM) to form a diffraction pattern on an image sensor, such as a CCD or CMOS camera or a fluorescent screen, or to form an Electron Energy Loss Spectrum (EELS) on such a sensor.

BACKGROUND OF THE INVENTION

A TEM comprises a particle source in the form of an electron source generating a beam of particles in the form of a beam of electrons. The electrons are accelerated to an energy of, for example, between 60 and 300 keV. The acceleration is preferably done by placing the electron source on a high voltage and accelerating them to ground potential. Deflectors and lenses then manipulate the beam so that it irradiates a sample. The sample is typically a thin sample of e.g. a biological material, or a semiconductor material with a thickness sufficiently small that it shows transparency to the electrons. To that end thicknesses between, for example, 30 nm (for samples comprising many high-Z atoms, such as semiconductor material or metallic samples) and 200 nm (for biological samples) are routinely used, although samples as thick as, for example, 1 µm may be used.

The beam, while passing through the sample, interacts with the sample. Some electrons pass through the sample unhindered, some electrons are diffracted, some electrons loose energy and some electrons are absorbed.

The electrons passing through the sample are then imaged on a sensor, such as a fluorescent screen. The fluorescent screen may be part of a camera system using a CCD sensor or a CMOS sensor. However, it is also known to form the image directly on a CMOS or CCD sensor. Such sensors capable of imaging 4000×4000 pixels are commercially available.

The TEM can be used in different ways to obtain information about the sample. In some modes the image is an image of the plane where the sample resides, and the intensity shows a distribution depending on the sample constitution.

In other modes, however, a localized high intensity peak is formed on the sensor independent of sample constitution. This is the case when, for example, a diffraction image or an electron energy loss spectrum (EELS) is formed on the sensor.

When forming a diffraction image on a sensor, a crystalline sample is irradiated with a parallel beam.

Diffraction occurs because the periodic structure of a crystalline solid acts as a diffraction grating, scattering the electrons in a predictable manner. Using the diffraction pattern it may be possible to deduce the structure of the crystal. A crystal with a simple unit cell can be determined using only a small number of spots, while a crystal with a complex unit cell, such as a protein crystal, may need as many as 800 spots to be characterized.

It is noted that a diffraction pattern not only provides information of the crystal and the molecules forming the crystal, and e.g. the position of atoms in the crystal, but it may also provide information of, for example, strain and dislocations in the crystal.

Thus, by imaging not the sample plane, but a plane where the (parallel) beam irradiating the sample is focused, an image is formed in which the position in the image corresponds with the angle under which the electrons leave the sample.

Best information is obtained when the image comprises no, or almost no, electrons that are scattered twice. This so-called "double scattering" is the effect in which scattered electrons are scattered again. To minimize double scattering the amount of scattered electrons should be much smaller than the amount of unscattered electrons. This is achieved by using sufficiently thin specimens, such as films with a thickness of 60-300 nm or less (depending on e.g. the energy of the electrons).

Therefore the spot corresponding with undiffracted electrons, also known as the central spot, shows a much higher intensity than the other spots.

When performing diffraction the image magnification is chosen such that the low intensity peaks have a diameter of approximately 3 pixels, so that the position can be determined with sufficient accuracy.

The intensity of the central peak, expressed in electrons per pixel, can be $10^3$ to $10^5$ higher than the highest intensity occurring in the low intensity peaks.

It is noted that, due to this high dynamic range, the central spot is often saturated, that is: the signal ratio of a weak spot with respect to the central spot is less than the electron flux between the two. In other words: the sensor is not linear for the electron flux in the central spot.

It is noted that the sensor is often allowed to saturate at the central spot, that is: the central spot is allowed to clip.

In EELS an energy spectrum is made of the electrons passing through the sample. Electrons passing through a sample may loose energy by so-named inelastic collisions, e.g. causing an atom from the ground state to an excited state, or by ionizations of an atom through which they pass. In an energy analyser placed between the sample and the camera the beam of particles is passed through an energy dispersive element. A line focus is formed on the camera, the position in the line corresponding with the energy loss of the electrons; and the intensity along the line corresponding with the probability of the corresponding energy loss. It is noted that the full width at half maximum (FWHM) often corresponds with the resolution in eV, also known as the dispersion of the spectrometer It is noted that an EELS spectrum can be made in a TEM equipped with an in-column filter, or with a post-column filter. An example of a commercially available post-column filter is e.g. the "GIF Tridiem" from GATAN Inc., Pleasanton, Calif., USA. This filter can be mounted on many commercially available TEM's.

As is the case in diffraction, most electrons pass through the sample unhindered, or at least without losing energy.

The so-named "zero energy loss peak" of the line spectrum, also named the "zero-loss peak" shows all electrons with an energy loss of e.g. less than 5 eV. This peak typically shows an intensity that is between $10^2$ and $10^3$ more intense than the intensity at other positions of the energy spectrum, thus farther removed from the zero loss peak.

The high local intensity of diffraction images and EELS spectra is often at the same position on the sensor, as it does not dependent of, for example, sample position, but only on the alignment and excitation of particle-optical elements, such as lenses, deflection systems and energy dispersive elements.

A disadvantage of the high local intensity on the sensor is that this may cause damage on the sensor. This damage may be the result of the peak intensity level (that is: the flux), but may also be the result of the high total dose at the high intensity location as a result of the time integrated high intensity level (that is: the total dose). Fluorescent screens can burn in, resulting in a lower response of a part of the screen. CCD chips and CMOS chips may deteriorate, resulting in, for example, higher noise levels or desensitising of pixels, ultimately leading to one or more dead pixels.

There is a need for a method of imaging images with a high intensity peak without damaging the sensor.

SUMMARY OF THE INVENTION

The invention relates to a method of using a direct electron detector in a TEM, in which an image with a high intensity peak, such as a diffractogram or an EELS spectrum, is imaged on said detector. As known the high intensity peak may damage the detector. To avoid this damage, the centre of the image is moved, as a result of which not one position of the detector is exposed to the high intensity, but the high intensity is smeared over the detector, displacing the high intensity peak before damage results.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The invention is now elucidated by means of figures, in which corresponding reference numerals indicate corresponding parts.

To that end.

FIG. $2^a$ shows a diffraction pattern.

FIG. $2^b$ schematically shows a diagram showing the intensity of the pattern of FIG. $2^a$ along a line, FIG. $2^c$ shows a the diagram of FIG. $2^b$ with a 35× magnification of the intensity, FIG. $3^a$ schematically shows an intensity diagram of an EELS spectrum, and FIG. $3^b$ shows the intensity diagram of FIG. $3^a$ with a 100× magnification of the intensity.

DETAILED DESCRIPTION OF PREFERRED EMBODIMENTS

The invention provides a method which decreases damage of the sensor.

To that end a second image is formed on the sensor after forming the first image, the second image displaced with respect to the first image, resulting in a different position of the high intensity peak on the sensor for the two images, as a result of which damage to the sensor or artefacts in the image due to prolonged overexposure of the sensor is decreased.

By repositioning the peak to another position on the sensor, a given location on the sensor is only exposed to the high intensity for a limited period, resulting in a lower local dose to which the sensor is exposed and to a smaller time during which damage occurs.

In an embodiment of the method according to the invention the images are diffraction images and the high intensity peak of each of the images is the central, undiffracted, peak.

Especially in diffraction of crystals with a large unit cell, such as proteins, the central spot, in which all undiffracted electrons are focused, shows an intensity per pixel that may be $10^5$ times higher than the intensity of the weakest spots that must be detected.

In another embodiment of the method according to the invention the images are electron energy loss spectra of the sample and the high intensity peaks are the zero loss peaks of the spectra.

In an EELS spectrum the zero loss peak, that is the peak where electrons that did not loose energy while passing through the sample are imaged, typically shows more intensity than other places of the spectrum, where electrons which lost energy are imaged. Therefore degradation of the sensor is most likely to occur at the position of the zero-loss peak. By changing the position where the zero loss peak is imaged on the sensor, degradation of one position is avoided, and at least spread over a larger area, where each point of the area shows less degradation than would occur were the zero loss peak not displaced.

In a further embodiment of the method according to the invention at least one of the images is an EELS spectrum and at least one image is displaced in a direction perpendicular to the electron energy loss spectrum.

As an EELS spectrum is typically a line spectrum with a size of, for example, 2000×200 pixels, that is projected on a detector with a larger pixel count, for example a 4000×4000 pixel detector, a shift perpendicular to the orientation of this line is the most effective way to image the spectrum on another part of the sensor.

In an embodiment of the method according to the invention the displacement means cause a mechanical movement of the sensor with respect to the apparatus.

Such a displacement can be realized, for example, by mounting the sensor on piezo-electric elements.

In another embodiment of the method according to the invention the displacement is caused by a deflection of the beam of particles by electrostatic and/or magnetic fields.

By deflecting the beam of particles with, for example, an electrostatic or magnetic deflector, the image is shifted over the sensor. As such deflectors are often already part of the apparatus, this can be done without changes to the hardware of the apparatus, and thus without further costs to the hardware of the apparatus. An example of a magnetic field is for example the sector magnet of an EELS filter, and an example of an electrostatic deflector is for example the drift tube positioned within the sector magnet of an EELS filter.

In yet another embodiment of the method according to the invention at least one of the images is part of a series of images, said series of images combined to form a combined image with a dynamic range higher than that of each image individually.

By combining N images, the maximum count per pixel increases by N as well, and thereby the dynamic range.

In a further embodiment of the method according to the invention the dynamic range of the combined image is larger than the dynamic range that can be achieved with the sensor for one image only.

In an embodiment of the method according to the invention at least one of the images is part of a series of images of an EELS spectrum, each of the images of said series showing an exposure time sufficiently small to avoid peak broadening due to fluctuations of the acceleration means, the images of said series combined in a combined image by shifting each image with respect to the other images in the series in such a way that the zero loss peak in each image corresponds with the zero loss peak of the combined image.

In yet another embodiment of the method according to the invention the displacement is a known displacement.

In still another embodiment of the method according to the invention the displacement is a determined by image recognition techniques.

In a further embodiment the image recognition technique comprises a correlation technique.

In an aspect of the invention a particle-optical apparatus comprising
- a particle source for producing a beam of particles,
- acceleration means for accelerating the beam of particles,
- lenses to manipulate the beam of particles,
- sample position means for positioning a sample on a sample position,
- a sensor for detecting an image of particles formed on it,
- a programmable controller for controlling the apparatus, is characterized in that
- the controller is programmed to control the apparatus to perform any of the methods the previously mentioned methods.

In an embodiment of the particle-optical apparatus according to the invention the apparatus comprises an in-column energy analyser or a post-column energy analyser.

In yet another aspect a software carrier for carrying software is characterized in that it comprises code to program the programmable controller to perform any of the previously mentioned methods.

Figure 1:
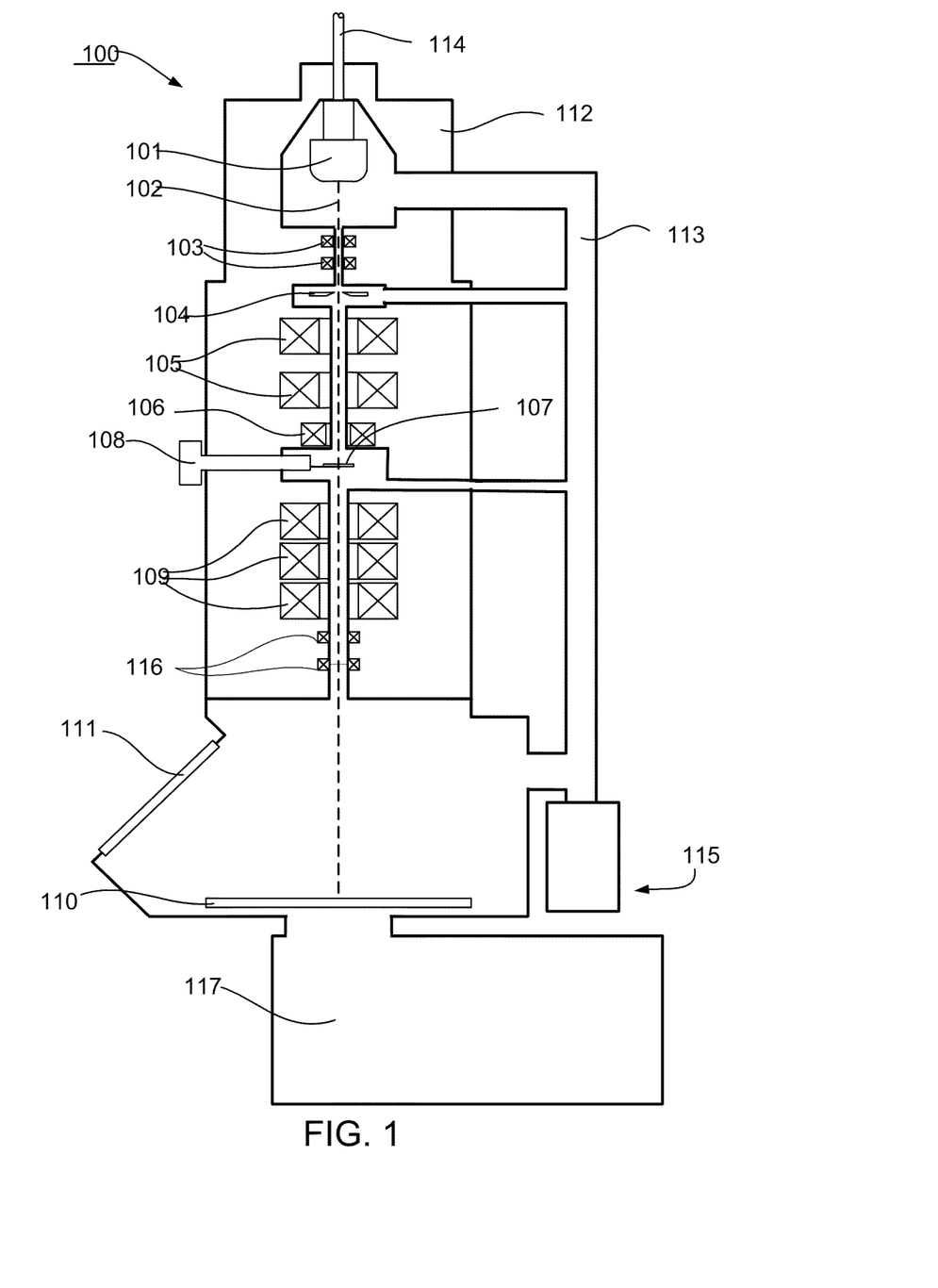
FIG. 1 schematically shows a transmission electron microscope, equipped with an EELS analyser.

FIG. 1 schematically shows a Transmission Electron Microscope (TEM) 100. The TEM comprises a housing 112 that is evacuated via vacuum tubing 113 by vacuum pumps 115. A high voltage cable 114 connects the electron source 101 with high voltage electronics (not shown). The electron source generates a beam of electrons along axis 102. Alignment coils 103 align the beam of electrons, aperture 104 limits the beam and condenser lenses 105 form an image of the electron source. Objective lens 106 then forms a parallel beam of electrons on the specimen 107. Specimen 107 is positioned by specimen holder 108. Lenses 109 then form an enlarged image of the specimen on a fluorescent screen 110, that can be observed via window 111. Deflection coils 116 further align the image on the screen. The screen 110 is often retractable or folding, and can thus be removed from the optical axis. The electrons can then impinge on a direct electron detector mounted under the folding screen (not shown) or on an electron energy loss filter 117.

By using the deflection coils 116 to displace the image on the image plane (e.g. the plane where the direct electron detector is placed), not the same part of the detector is used for the high intensity peaks all the time.

Figure 2A:
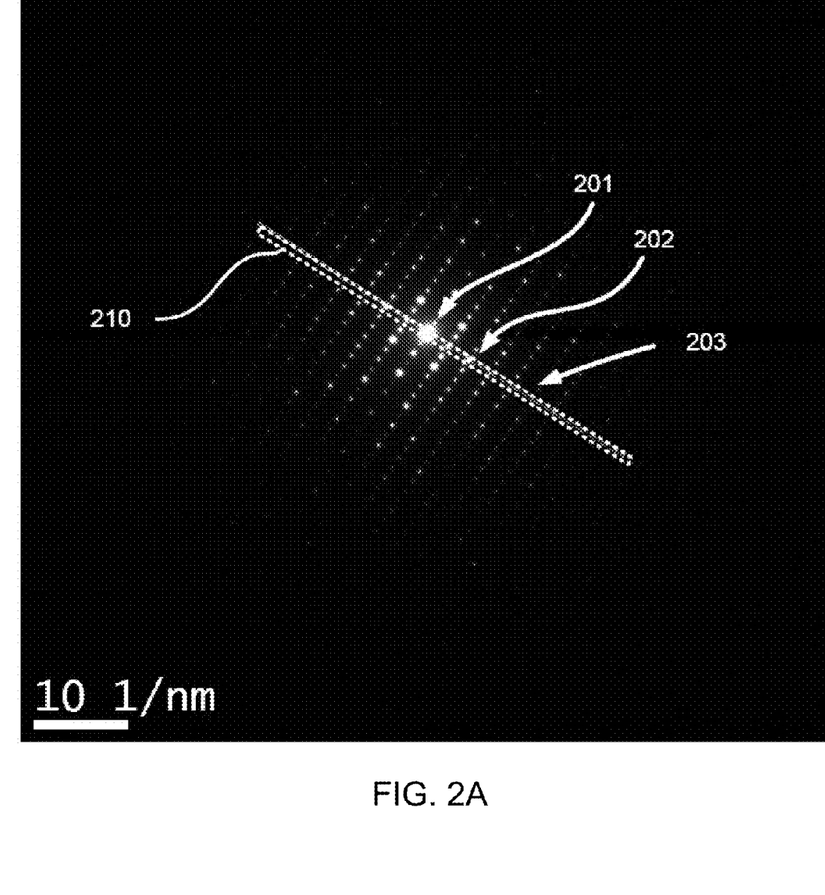

FIG. $2^a$ shows a diffraction pattern.

FIG. $2^a$ shows a diffraction pattern with a central peak 201 surrounded by a large number of surrounding peaks, such as spot 202 and spot 203.

Spot 201 is caused by undiffracted electrons impinging on the sensor, the camera, such as a CCD camera or a CMOS camera.

Each of the surrounding spots is caused by electrons that are diffracted. The intensity of such surrounding spots, such as spot 202, is much lower than the intensity of the central spot. In other words: the number of electrons per pixel forming spot 202 is much lower than the number of electrons per pixel forming central spot 201.

As mentioned earlier, diffraction occurs due to the periodic structure of a crystal. Using the diffraction pattern the structure of the crystal is deduced.

The position of the low intensity peaks must thus be determined with sufficient accuracy. Therefore, when forming the image on a CCD camera or a CMOS camera, the magnification of the image is chosen such that the diameter at Full Width at Half Maximum (FWHM), the so-named $D_{FWHM}$, of the smallest spots to be observed, such as spot 203, corresponds with, for example, 3 pixels of the camera. Such a spot thus comprises some 9 pixels, each with a different number of electrons. For a sufficient signal-to-noise ratio the pixel with the highest exposure should be exposed with approximately 30 electrons.

The exposure of 30 electrons/pixel for a weak spot has as a consequence that the central peak, showing all undiffracted electrons, may have a maximum of, for example, $10^4$ electrons/pixel.

Figure 2B:
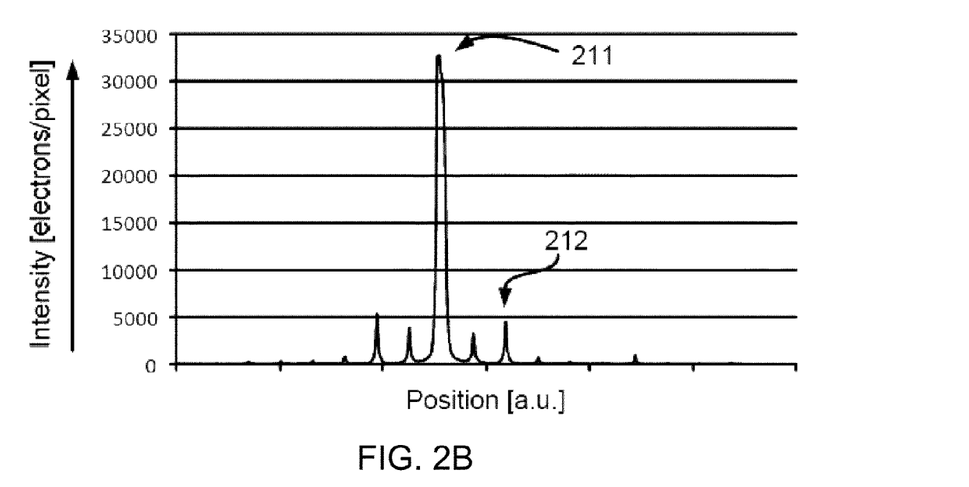

FIG. $2^b$ depicts the intensity per pixel along line 210 as shown in FIG. $2^a$.

It shows the strong central peak 211, with a intensity as high as 32000 electrons/pixel, and a much weaker peak 212. As a matter of fact, inspection of the raw data revealed that the central peak is already 'clipped', and the actual illumination may be twice as high.

Figure 2C:
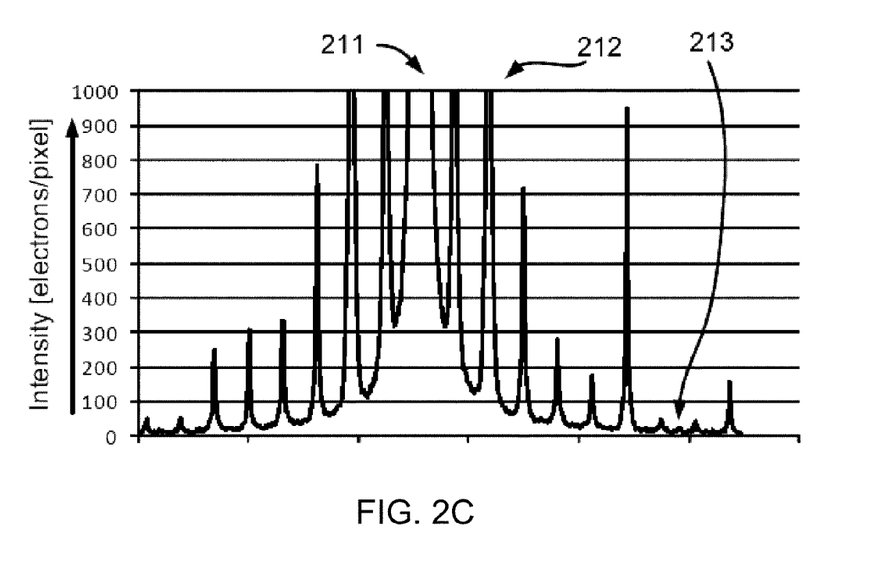

In FIG. $2^c$, in which the maximum intensity displayed is reduced to 1000 electrons/pixel, also much weaker spots can be detected, such as peak 213, showing an intensity of approximately 25 electrons/pixel.

Figure 3A:
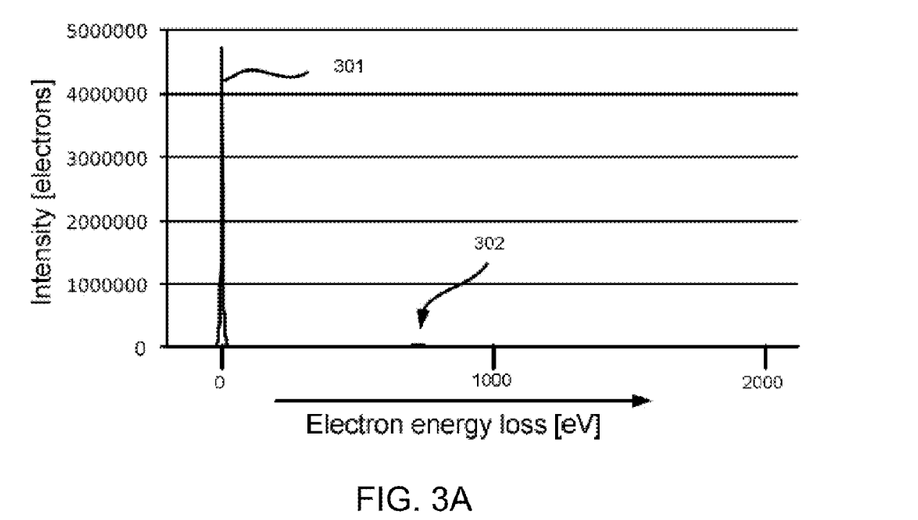
Figure 3B:
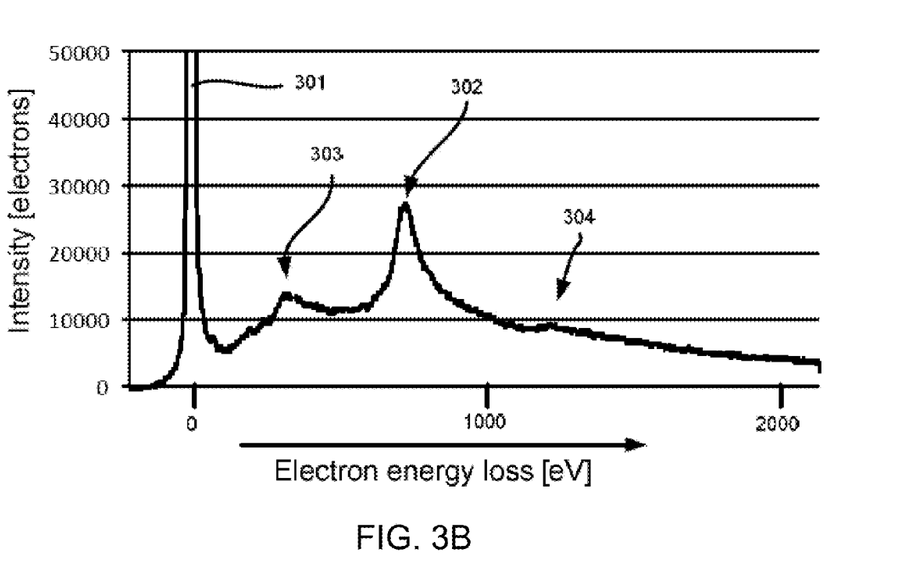

FIGS. $3^a$ and $3^b$ schematically shows intensity diagrams of an EELS spectrum, in which FIG. $3^b$ shows the intensity diagram of FIG. $3^a$ with a 100× magnification of the intensity.

In Electron Energy Loss Spectroscopy (EELS) a line image is formed in which the different positions along the line representing different energies of the electrons. The line image is formed on a sensor such as a pixelated camera. Imaging conditions are typically set such that the line corresponds with 2000×100 pixels, the camera showing a larger number of pixels, e.g. 4000×4000 pixels.

It is noted that the camera is often capable of receiving a square or round image corresponding with 4000×4000 pixels, even though the EELS spectrum is a line image, as the camera is used for other imaging modes as well, requiring such a square or round imaging field.

The intensity of the pixels perpendicular to the direction of the line is then integrated, and represented in an intensity diagram as shown in FIGS. $3^a$ and $3^b$.

FIG. $3^a$ shows such an intensity diagram in which horizontally the energy loss is shown and vertically the (integrated) intensity.

The figure shows a so-named zero-loss peak 301 corresponding to the electrons that lost no energy, or less than, for example, 5 eV. The figure further shows barely visible peak 302 of electrons loosing an energy of approximately 800 eV.

It is noted that, to avoid that an electron loses energy in multiple interactions, the sample is preferably thinned to a thickness sufficiently thin that little electrons experience multiple interactions. However, as a consequence most electrons do not undergo any interaction at all, and thus the largest amount of electrons will be located at the zero loss position.

In FIG. $3^b$ the intensity is magnified, and now peak 302 is well discernable. Its intensity is approximately 30000 electrons, some 20 times less than the zero-loss peak. At approximately 250 eV energy loss a peak 303 is discernable with an intensity of approximately 13000 electrons, while at approximately 1200 eV energy loss a peak 304 is visible, with an intensity of less than 10000 electrons, or more than 450 times less than the intensity of peak 301. As will be clear to the person skilled in the art, damage to the camera is for the pixels detecting peak 301 much higher than that of peaks removed from the high intensity area.

Figure 4:
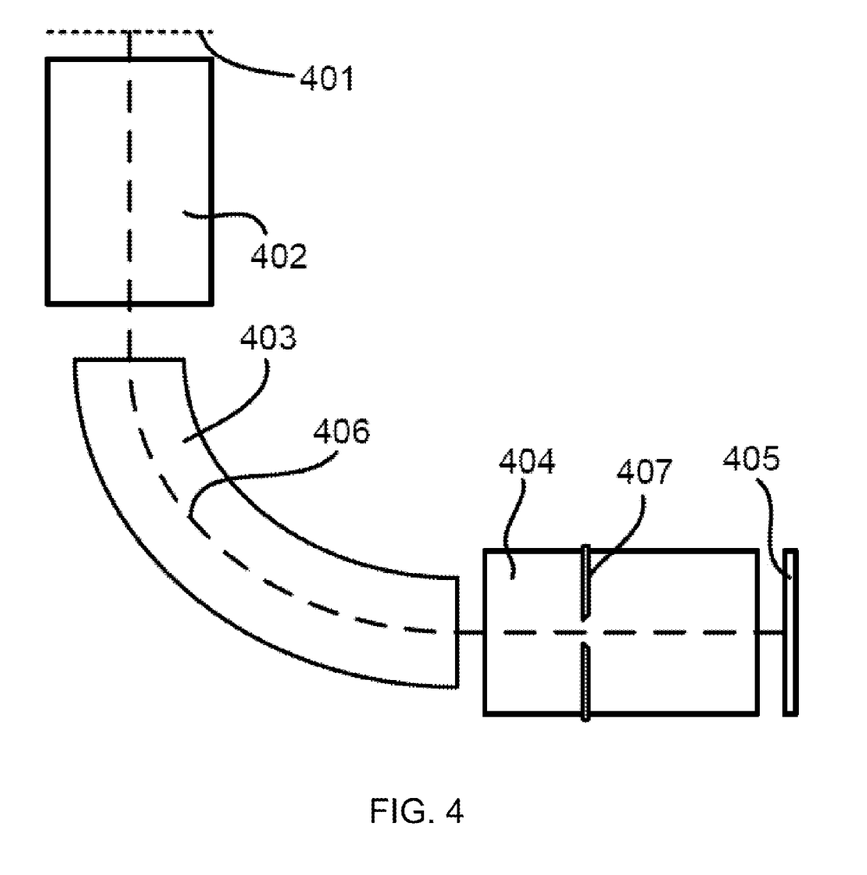
FIG. 4 schematically shows a post-column EELS system.

FIG. 4 schematically shows an EELS system.

The EELS system is mounted under a TEM 100 (not shown), and shows an entrance plane 401 coinciding with the image plane of the TEM. It further shows a first group of optical elements 402, an energy dispersive element 403 in the form of a sector magnet, a second group of optical elements 404, and a camera chip 405.

The sector magnet typically has a nominal deflection of the electron-optical axis 406 of 90°. Electrons with a low energy are deflected over a larger angle.

It is noted that an EELS analyser is often capable of operating in another mode, in which only electrons with a selectable energy loss are imaged. To that end the EELS system shows an slit aperture 407, and more elaborate optics than necessary for forming an EELS line spectrum.

As is clear from the above FIGS. 2 and 3 the camera is illuminated very unevenly. The invention is to deflect the image over the camera between two acquisitions. This can be realized by mechanically moving the camera chip, as is done in some reflex camera systems Another way is to shift the image over the chip with optical means, such as an magnetic or electrostatic deflector.

It is noted that the deflection system can be part of the TEM, for example deflector 116, or may be incorporated in one or both of the optical systems of the EELS system, or can take the form of a mechanical system in the chip mounting.

The shift can be a random shift, or it can be a pre-determined shift. The first possibility may be used when the two subsequent images need not be combined, the latter is preferred when combining images to form a combined image. This is done when e.g. combining images to avoid clipping of the camera.

When performing EELS combining of images is especially attractive to eliminate the effect of energy fluctuations of the impinging electron beam. This is explained as follows: the high voltage used to accelerate the electrons is well regulated, but some residual fluctuations of e.g. 0.25 V is superimposed on the voltage of e.g. 250 kV Likewise noise in deflectors and/or the energy dispersive element (a sector magnet) results in shifts of the image.

When an image is made with a short illumination time the fluctuations within that small time interval is much smaller. By now combining several images with a short illumination time, and determining their relative shift, an EELS spectrum with an improved resolution can be formed. It is irrelevant whether the shift of the images is the result of an energy fluctuation or a deliberate shift of the image and/or camera chip to avoid over-illumination.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application.

Further, it should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines,

We claim as follows:

1. A method of using an image sensor in a particle-optical apparatus, the particle-optical apparatus comprising:
   a particle source for producing a beam of particles,
   acceleration means for accelerating the beam of particles,
   lenses to manipulate the beam of particles,
   sample position means for positioning a sample on a sample position, and
   a sensor for detecting an image of particles formed on it,
   the method comprising:
   providing a sample on the sample position,
   forming a first diffraction image on the sensor showing a high intensity peak at a first position, and lower intensity peaks at other positions, and
   forming a second diffraction image on the sensor after forming the first image, the second image displaced with respect to the first image, resulting in a different position of the high intensity peak on the sensor for the two images, as a result of which damage to the sensor or artifacts in the image due to prolonged overexposure of the sensor is decreased,
   wherein the high intensity peak of each of the images is the central, undiffracted peak.

2. The method of claim 1 in which the displacement is caused by a mechanical movement of the sensor with respect to the apparatus.

3. The method of claim 1 in which the displacement is caused by a deflection of the beam of particles by electrostatic and/or magnetic fields.

4. The method of claim 1 in which at least one of the images is part of a series of images, said series of images combined to form a combined image with a dynamic range higher than that of each image individually.

5. The method of claim 4 in which the dynamic range of the combined image is larger than the dynamic range that can be achieved with the sensor for one image only.

6. The method of claim 1 in which the displacement is a known displacement.

7. The method of claim 1 in which the displacement is determined by an image recognition technique.

8. The method of to claim 7 in which the image recognition technique comprises a correlation technique.

9. A particle-optical apparatus comprising
   a particle source for producing a beam of particles,
   acceleration means for accelerating the beam of particles,
   lenses to manipulate the beam of particles,
   sample position means for positioning a sample on a sample position,
   a sensor for detecting an image of particles formed on it, and
   a programmable controller for controlling the apparatus, wherein the controller is programmed to cause the apparatus to perform the following steps:
   providing a sample on the sample position,
   forming a first diffraction image on the sensor showing a high intensity peak at a first position, and lower intensity peaks at other positions, and
   forming a second diffraction image is formed on the sensor after forming the first image, the second image displaced with respect to the first image, resulting in a different position of the high intensity peak on the sensor for the two images, as a result of which damage to the sensor or artifacts in the image due to prolonged overexposure of the sensor is decreased,
   wherein the high intensity peak of each of the images is the central, undiffracted peak.

10. The particle-optical apparatus of claim 9 equipped with an in-column energy analyser or a post-column energy analyser.

11. The apparatus of claim 9 in which the displacement is caused by a mechanical movement of the sensor with respect to the apparatus.

12. The apparatus of claim 9 in which the displacement is caused by a deflection of the beam of particles by electrostatic and/or magnetic fields.

13. A nontransitory, computer-readable medium encoded with computer-executable instructions for using an image sensor in a particle-optical apparatus, the particle-optical apparatus comprising:
   a particle source for producing a beam of particles,
   acceleration means for accelerating the beam of particles,
   lenses to manipulate the beam of particles,
   sample position means for positioning a sample on a sample position,
   a sensor for detecting an image of particles formed on it,
   a programmable controller for controlling the apparatus; and
   the computer-executable instructions, when executed by the programmable controller, cause the particle-optical apparatus to perform the following steps:
   providing a sample on the sample position,
   forming a first diffraction image on the sensor showing a high intensity peak at a first position, and lower intensity peaks at other positions, and
   forming a second diffraction image on the sensor after forming the first image, the second image displaced with respect to the first image, resulting in a different position of the high intensity peak on the sensor for the two images, as a result of which damage to the sensor or artifacts in the image due to prolonged overexposure of the sensor is decreased,
   wherein the high intensity peak of each of the images is the central, undiffracted peak.

* * * * *